(12) United States Patent
Zeng (10) Patent No.: US 12,418,014 B2
(45) Date of Patent: Sep. 16, 2025

(54) METHOD FOR PROCESSING NEGATIVE ELECTRODE PLATE, SODIUM-METAL NEGATIVE ELECTRODE PLATE AND RELATED DEVICE

(71) Applicant: CONTEMPORARY AMPEREX TECHNOLOGY (HONG KONG) LIMITED, Hong Kong (CN)

(72) Inventor: Yuqun Zeng, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 231 days.

(21) Appl. No.: 18/190,314

(22) Filed: Mar. 27, 2023

(65) Prior Publication Data

US 2023/0238505 A1 Jul. 27, 2023

Related U.S. Application Data

(63) Continuation of application No. PCT/CN2022/077646, filed on Feb. 24, 2022.

(30) Foreign Application Priority Data

Jun. 26, 2021 (CN) .......................... 202110742797.2

(51) Int. Cl.
 *H01M 4/04* (2006.01)
 *C23C 16/04* (2006.01)
 (Continued)

(52) U.S. Cl.
 CPC ......... *H01M 4/0428* (2013.01); *C23C 16/045* (2013.01); *C23C 16/405* (2013.01);
 (Continued)

(58) Field of Classification Search
 None
 See application file for complete search history.

(56) References Cited

U.S. PATENT DOCUMENTS

| 5,124,180 A | 6/1992 | Proscia |
| 2019/0393543 A1 | 12/2019 | Zhamu et al. |
| 2021/0159493 A1* | 5/2021 | Xiao ..................... H01M 4/405 |

FOREIGN PATENT DOCUMENTS

| CN | 1745034 A | 3/2006 |
| CN | 102502745 A | 6/2012 |

(Continued)

OTHER PUBLICATIONS

ISR for International Application PCT/CN2022/077646 mailed May 5, 2022.

(Continued)

*Primary Examiner* — Tracy M Dove
(74) *Attorney, Agent, or Firm* — Ladas & Parry LLP (57) ABSTRACT

A method for processing a negative electrode plate, a sodium-metal negative electrode plate and related devices. In a vacuum environment, the metal vapor reacts with oxygen, and the metal oxide formed by the reaction is plated on the surface of the sodium-metal negative electrode plate to form a metal oxide protective layer with high mechanical strength and stable chemical properties. The metal oxide protective layer can greatly reduce the phenomenon of low yield and performance deterioration caused by the reaction of sodium metal with air and water during the processing of the sodium-metal negative electrode plate. Since the metal oxide has a nanoscale thickness, it can form a corresponding sodium salt with sodium metal under electrochemical conditions, thereby improving the sodium ion transport rate on the surface of the sodium-metal negative electrode plate and improving the battery's kinetic performance.

6 Claims, 1 Drawing Sheet

(51) Int. Cl.
*C23C 16/40* (2006.01)
*H01M 4/131* (2010.01)
*H01M 4/134* (2010.01)
*H01M 4/1395* (2010.01)
*H01M 4/36* (2006.01)
*H01M 4/38* (2006.01)
*H01M 4/62* (2006.01)
*H01M 10/42* (2006.01)
*H01M 4/02* (2006.01)

(52) U.S. Cl.
CPC ....... *H01M 4/0404* (2013.01); *H01M 4/0471* (2013.01); *H01M 4/131* (2013.01); *H01M 4/134* (2013.01); *H01M 4/1395* (2013.01); *H01M 4/366* (2013.01); *H01M 4/381* (2013.01); *H01M 4/62* (2013.01); *H01M 10/4235* (2013.01); *H01M 2004/021* (2013.01); *H01M 2004/027* (2013.01)

(56) References Cited

FOREIGN PATENT DOCUMENTS

| | | | |
|---|---|---|---|
| CN | 102637922 | A | 8/2012 |
| CN | 104354362 | A | 2/2015 |
| CN | 106207087 | A | 12/2016 |
| CN | 107369813 | A | 11/2017 |
| CN | 207498454 | U | 6/2018 |
| CN | 108336301 | A | 7/2018 |
| CN | 108987695 | A | 12/2018 |
| CN | 110112363 | A | 8/2019 |
| CN | 110661000 | A | 1/2020 |
| CN | 110943227 | A | 3/2020 |
| CN | 112531145 | A | 3/2021 |
| CN | 113437248 | A | 9/2021 |
| JP | 2004192829 | A | 7/2004 |
| KR | 20170122134 | A | 11/2017 |
| WO | 2015157880 | A1 | 10/2015 |
| WO | 2019057273 | A1 | 3/2019 |
| WO | 2019057274 | A1 | 3/2019 |

OTHER PUBLICATIONS

Written Opinion for International Application PCT/CN2022/077646 mailed May 5, 2022.
First Chinese Office Action issued on counterpart application 202110742797.2 dated Oct. 22, 2021.
Notification to Grant issued on counterpart application 202110742797.2 dated Jan. 13, 2022.
Chinese Office Action issued on counterpart application 202210181297.0, dated Jun. 13, 2023.
Notice of the Granting of a Patent Right for an Invention issued on counterpart application CN 202210181297.0, dated Oct. 12, 2023.
European Search Report issued on counterpart application 22798044.8, dated Dec. 11, 2023.
Yang Zhao et al., "Superior Stable and Long Life Sodium Metal Anodes Achieved by Atomic Layer Deposition", Advanced Materials, 2017, pp. 1-7.
Fan Yu, et al., Electrode Engineering by Atomic Layer Deposition for Sodium-Ion Batteries: From Traditional to Advanced Batteries, Advanced Functional Materials, Wiley—VCH Verlag GmbH & Co. KGAA, DE, vol. 30, No. 9, Dec. 3, 2019, pp. 1-28.

* cited by examiner

METHOD FOR PROCESSING NEGATIVE ELECTRODE PLATE, SODIUM-METAL NEGATIVE ELECTRODE PLATE AND RELATED DEVICE

CROSS-REFERENCE TO RELATED APPLICATION

This application is a continuation of PCT/CN2022/077646 filed Feb. 24, 2022 which claims priority to Chinese Patent Application No. 202110742797.2 filed on Jun. 26, 2021. These applications are incorporated herein by reference in its entirety.

TECHNICAL FIELD

This application relates to the technical field of secondary batteries, and specifically relates to a method for processing negative electrode plates, sodium-metal negative electrode plates and related devices.

BACKGROUND

With the increasing prominence of energy and environmental problems, the new energy industry has received more and more attention. Lithium-ion batteries have been widely used as an important new energy storage device in recent years due to their high energy density and good cycle performance. However, due to the scarcity of active material resources related to lithium-ion batteries, the cost of batteries remains high, and at the same time, there are serious problems such as the exhaustion of related active material resources. Therefore, other low-cost metal-ion secondary battery systems need to be developed.

Sodium-ion batteries have become a popular research direction in recent years due to their low cost, abundant resources, and similar manufacturing process as the lithium-ion battery. However, due to the low gram density and voltage platform of the current positive and negative electrode materials of sodium-ion batteries, there is always a large gap between the energy density of sodium-ion batteries and the energy density of lithium-ion batteries, which cannot be truly commercialized. Under the background that the energy density of the positive electrode material has never been broken through, the direct use of sodium metal (theoretical specific capacity of 1166 mAh/g) as the negative electrode has become an effective method to greatly improve the energy density of the battery. However, due to the poor chemical stability of sodium metal in the air, low melting point (98° C.), and easy formation of sodium dendrites during electrochemical cycling, there are major problems in the preparation process and cycle life of sodium-metal negative electrode batteries. Commercial applications are currently unavailable.

SUMMARY

The present application provides a method for processing negative electrode plate, sodium-metal negative electrode plate and related device, wherein a metal oxide protective layer on the surface of the negative electrode plate has high mechanical strength and is chemically stable, so that electrochemical device has good cycle performance, high initial charge-discharge efficiency and manufacturability.

In a first aspect, the present application provides a method for processing negative electrode plate, including the following steps: arranging at least one negative electrode plate in a vacuum chamber, wherein the negative electrode plate is close to an oxygen-containing gas generator and a metal vapor generator, and wherein the side of the negative electrode plate close to the oxygen-containing gas generator is provided with a porous barrier layer; melting the metal material and ejecting metal vapor by the metal vapor generator, so that the negative electrode plate is immersed in the metal vapor, wherein the ejection flow rate of the metal vapor is x ml, the density of the metal material is p g/cm, and the relative atomic mass of the metal material is M;

ejecting oxygen-containing gas by the oxygen-containing gas generator along the porous barrier layer, wherein the ejection flow rate of the oxygen-containing gas is y ml;

directly reacting the oxygen-containing gas distributed on the surface of the negative electrode plate with the metal vapor to generate metal oxide, so that the metal oxide is plated on the surface of the negative electrode plate to form a metal oxide protective layer, wherein the molar ratio of metal atoms to oxygen atoms in the metal oxide is z, and wherein $z=22.4 \cdot x \cdot \rho/(y \cdot M)$.

In the above-mentioned embodiment, the metal oxide protective layer can greatly reduce the phenomenon of low yield and performance deterioration caused by the reaction of sodium metal with air and water, which is easy for the sodium-metal negative electrode plate to occur during processing. Since the metal oxide protective layer has a nanoscale thickness, it can form a corresponding sodium salt with sodium metal under electrochemical conditions, thereby improving the sodium ion transport rate on the surface of the sodium-metal negative electrode plate and improving the kinetic performance of battery. Moreover, the metal oxide protective layer has high mechanical strength, which can maintain the structural integrity of the sodium-metal negative electrode plate when the volume changes during charge and discharge, prevent the direct contact between the sodium metal and the electrolyte to form a large number of sodium dendrites, and improve the battery cycle performance.

In a feasible embodiment, the negative electrode plate includes a negative electrode current collector and a sodium metal material formed on the surface of the negative electrode current collector.

In a feasible embodiment, the negative electrode current collector includes at least one of a copper foil current collector, an aluminum foil current collector, a copper-based composite current collector, and an aluminum-based composite current collector.

In a feasible embodiment, it satisfies at least one of the following characteristics:
(1) The molar ratio of metal atoms to oxygen atoms in the metal oxide is z, $0.2 \leq z \leq 1.9$;
(2) The molar ratio of metal atoms to oxygen atoms in the metal oxide is z, $0.4 \leq z \leq 1.7$;
(3) The metal oxide protective layer has a thickness of from 50 nm to 500 nm.

In a feasible embodiment, the metal material includes at least one of magnesium, aluminum, zirconium, titanium, vanadium, chromium, and manganese.

In a feasible embodiment, it satisfies at least one of the following characteristics:
(1) The porous barrier layer is a porous metal mesh, and the material of the porous metal mesh includes at least one of iron, titanium, tungsten, and molybdenum;
(2) The porous barrier layer has a pore size of from 40 μm to 100 μm;
(3) The distance between two adjacent holes in the porous barrier layer is from 0.1 mm to 1 mm.

In a feasible embodiment, the porous barrier layer is connected with a heating device, and the heating device is configured to regulate the temperature of the porous barrier layer; and/or, the temperature of the porous barrier layer is from 120° C. to 400° C.

In a feasible embodiment, the vacuum degree of the vacuum environment is $\leq 8 \times 10^{-2}$ Pa.

In a second aspect, the present application provides a sodium-metal negative electrode plate, wherein the sodium-metal negative electrode plate includes a negative electrode current collector and a sodium metal material formed on the surface of the negative electrode current collector, and wherein the surface of sodium metal material is provided with a metal oxide protective layer formed by the above-mentioned processing method.

In a third aspect, the present application provides an electrochemical device, including a positive electrode plate, a negative electrode plate, a separator and an electrolyte, wherein the negative electrode plate is the sodium-metal negative electrode plate as described above.

In a feasible embodiment, the positive electrode plate includes a positive electrode current collector and a positive electrode active material layer formed on at least part of the surface of positive electrode current collector, wherein the positive electrode active material layer includes a positive electrode active material, and the positive electrode active material includes at least one of sodium transition metal oxides, polyanionic compounds and Prussian blue compounds.

In a fourth aspect, the present application provides a preparation device, for preparing the metal oxide protective layer on the surface of the negative electrode plate, wherein the preparation device includes a vacuum chamber, a vacuum unit, an oxygen-containing gas generator, a porous barrier layer and a metal vapor generator. The vacuum chamber includes an accommodating cavity for arranging at least one negative electrode plate therein; the vacuum unit is configured to provide a vacuum degree for the vacuum chamber; the oxygen-containing gas generator is located in the accommodating cavity and is arranged close to the negative electrode plate, and the oxygen-containing gas generator is configured to eject oxygen-containing gas into the accommodating cavity; the porous barrier layer is located in the accommodating cavity and is arranged on the side of the negative electrode plate close to the oxygen-containing gas generator; the metal vapor generator is located in the accommodating cavity and is arranged close to the negative electrode plate, wherein the metal vapor generator is configured to melt the metal material and eject the metal vapor to the negative electrode plate.

In a feasible embodiment, the metal vapor generator is arranged at the bottom of the vacuum chamber, the porous barrier layer is arranged in the middle of the vacuum chamber, and at least one oxygen-containing gas generator is arranged on both sides of the porous barrier layer.

In a possible embodiment, an oxygen-containing gas generator is configured to eject the oxygen-containing gas along the porous barrier layer.

DESCRIPTION OF THE DRAWINGS

In order to illustrate the technical solutions of the embodiments of the present application more clearly, the accompanying drawings used in the embodiments of the present application will be briefly introduced below. Obviously, the accompanying drawings described below are only some implementations of the present application. By way of example, for those of ordinary skill in the art, other drawings can also be obtained according to the drawings without any creative effort.

REFERENCE SIGNS

1—negative electrode plate;
2—vacuum chamber;
3—oxygen-containing gas generator;
4—metal vapor generator;
5—porous barrier layer;
6—metal material;
7—metal vapor;
8—vacuum unit.

DETAILED DESCRIPTION

In order to make the purpose, technical solutions and advantages of the present application clearer, the application will be described in further detail below in conjunction with the accompanying drawings and embodiments. It should be understood that the specific embodiments described herein are only used to explain the present application, but not to limit the present application.

In the description of this specification, unless otherwise expressly stated and limited, the terms "first" and "second" are only used for the purpose of description, and cannot be interpreted as indicating or implying relative importance; unless otherwise specified or explained, the term "multiple" refers to two or more; the terms "connected", "fixed", etc. should be understood in a broad sense, for example, "connected" can be a fixed connection or a detachable connection, or an integral connection, or an electrical connection; it can be directly connected or indirectly connected through an intermediate medium.

For those skilled in the art, the specific meanings of the above terms in the present application can be understood according to specific circumstances.

In the description of the present specification, it should be understood that the azimuths such as "upper", "lower" and the like described in the embodiments of the present application are described with the angle shown in the accompanying drawings, and should not be construed as limitations on the embodiments of the present application. Also, in the context, it should also be understood that when an element is referred to as being "on" or "under" another element, it can not only be directly connected "on" or "under" the other element, but also indirectly connected "on" or "under" another element through intervening elements.

In a first aspect, the present application provides a method for processing negative electrode plate, comprising the following steps:

Step S10: arranging at least one negative electrode plate in a vacuum chamber, wherein the negative electrode plate is close to an oxygen-containing gas generator and a metal vapor generator, and wherein the side of the negative electrode plate close to the oxygen-containing gas generator is provided with a porous barrier layer; melting the metal material and ejecting metal vapor by the metal vapor generator, so that the negative electrode plate is immersed in the metal vapor, wherein the ejection flow rate of the metal vapor is x ml, the density of the metal material is ρ g/cm, and the relative atomic mass of the metal material is M.

Step S20: ejecting oxygen-containing gas by the oxygen-containing gas generator along the porous barrier layer, wherein the ejection flow rate of the oxygen-containing gas is y ml.

Step S30: directly reacting the oxygen-containing gas distributed on the surface of the negative electrode plate with the metal vapor to generate a metal oxide, so that the metal oxide is plated on the surface of the negative electrode plate to form a metal oxide protective layer, wherein the molar ratio of metal atoms to oxygen atoms in the metal oxide is z, and wherein $z=22.4 \cdot x \cdot \rho/(y \cdot M)$.

In the above-mentioned embodiment, the metal oxide protective layer can greatly reduce the phenomenon of low yield and performance deterioration caused by the reaction of sodium metal with air and water, which is easy for the sodium-metal negative electrode plate to occur during processing. Since the metal oxide protective layer has a nanoscale thickness, it can form a corresponding sodium salt with sodium metal under electrochemical conditions, thereby improving the sodium ion transport rate on the surface of the sodium-metal negative electrode plate and improving the kinetic performance of battery. Moreover, the metal oxide protective layer has high mechanical strength, which can maintain the structural integrity of the sodium-metal negative electrode plate when the volume changes during charge and discharge, prevent the direct contact between the sodium metal and the electrolyte to form a large number of sodium dendrites, and improve the battery cycle performance.

Figure 1:
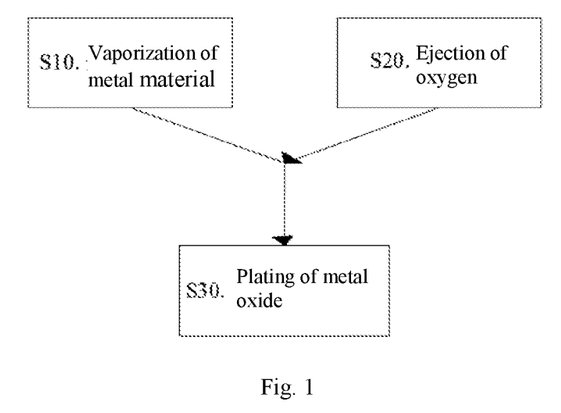
FIG. 1 is the schematic flow chart of the method for processing the metal oxide protective layer on the surface of the negative electrode plate which is provided by an embodiment of the present application.
Figure 2:
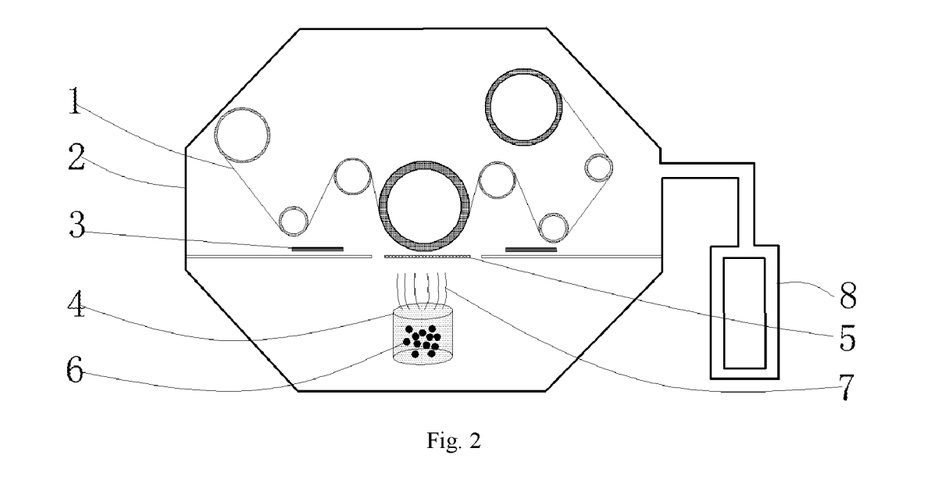
FIG. 2 is the structural diagram of the device for preparing the metal oxide protective layer on the surface of the negative electrode plate which is provided by an embodiment of the present application.

The present application is described in detail below in conjunction with the embodiments:

FIG. 1 is the schematic flow chart of the method for processing the metal oxide protective layer on the surface of the negative electrode plate which is provided by an embodiment of the present application; FIG. 2 is the structural diagram of the device for preparing the metal oxide protective layer on the surface of the negative electrode plate which is provided by an embodiment of the present application. As shown in FIG. 1 and FIG. 2, in step S10, at least one negative electrode plate 1 is arranged in the vacuum chamber 2, the negative electrode plate 1 is close to the oxygen-containing gas generator 3 and the metal vapor generator 4, and a porous barrier layer 5 is provided on the side of the negative electrode plate 1 close to the oxygen-containing gas generator 3. The metal vapor generator 4 melts the metal material 6 and ejects the metal vapor 7, so that the negative electrode plate 1 is immersed in the metal vapor 7, wherein the eject flow rate of the metal vapor 7 is x ml, the density of the metal material 6 is ρ g/cm$_3$, the relative atomic mass of the metal material 6 is M.

As an optional technical solution of the present application, the negative electrode plate 1 comprises a negative electrode current collector and a sodium metal material formed on the surface of the negative electrode current collector. The sodium metal material can be applied on the surface of the negative electrode current collector by micro gravure coating, comma roll coating, slit extrusion coating and the like. Optionally, the negative electrode current collector comprises at least one of a copper foil current collector, an aluminum foil current collector, a copper-based composite current collector, and an aluminum-based composite current collector.

It should be noted that the copper-based composite current collector or the aluminum-based composite current collector comprises an upper metal layer, a lower metal layer, and a non-metallic layer disposed between the upper metal layer and the lower metal layer. Vacuum plating, electrolytic plating or composite bonding is used for connections between the upper metal layer and the non-metal layer and between the non-metal layer and the lower metal layer. The thickness of the non-metal layer is controlled between 2 μm and 20 μm. The thickness of the lower metal layer is controlled between 1 μm and 10 μm. Non-metallic layers comprise polyester, polypropylene, polyamide, polyimide, polyethylene, polyethylene oxide, polyvinyl chloride, acrylonitrile-butadiene-styrene copolymer, polycarbonate, polymethyl methacrylate, polytetrafluoroethylene, polyvinyl alcohol, and non-woven fabric. The upper metal layer and the lower metal layer are made of metal alloy materials with metal copper or metal aluminum as the metal main body. A metal element is added to the metal alloy material, and the added metal element comprises at least one of gold, tungsten, platinum, iron, cobalt, nickel, magnesium, zinc, and chromium, and the amount of the added metal element is within 5% of the total mass of the metal body.

The vacuum chamber 2 comprises a vacuum chamber shell and an internal accommodating cavity. The vacuum chamber shell can be made of rolled metal sheets.

Optionally, for the vacuum chamber 2 that does not require a high degree of vacuum, the available metal sheets can be low-carbon steel sheets, alloy steel sheets, aluminum sheets and copper sheets, which is not limited herein. Preferably, a stainless steel plate is generally used for the vacuum chamber 2 that requires a high degree of vacuum.

Please continue to refer to FIG. 2, oxygen-containing gas generator 3, metal vapor generator 4, and porous barrier layer 5 are be provided in the accommodating cavity, metal vapor generator 4 is arranged at the bottom of vacuum chamber 2, and porous barrier layer 5 is arranged in the middle of the vacuum chamber 2, and at least one oxygen-containing gas generator 3 is arranged on both sides of the porous barrier layer 5.

The oxygen-containing gas generator 3 is an oxygen injection device, and is configured to eject oxygen to the accommodating cavity. In particular, the oxygen-containing gas generator 3 can produce oxygen by adopting oxygen production technologies such as alkali metal superoxide oxygen production, chlorate oxygen production or percarbonate oxygen production. Chlorate oxygen production technology is preferred. This technology has high stability, and the prepared oxygen flow rate is stable The metal vapor generator 4 is configured to melt and vaporize metal, and techniques such as resistance heating method, electron beam heating method, high frequency induction heating method and laser beam heating method can be used to vaporize metal. In practical application, the metal material 6 used may be at least one of magnesium material, aluminum material, zirconium material, titanium material, vanadium material, chromium material and manganese material, preferably zirconium material. The melting point of the metal material 6 should not be too high. If the melting point is too high, the energy consumption is high, and too high the temperature of the vaporized material would damage the negative electrode plate 1.

In step S20, oxygen-containing gas generator 3 ejects oxygen-containing gas along porous barrier layer 5, and the eject flow rate of oxygen-containing gas is y ml.

Specifically, in the metal vapor generator 4, after the metal material 6 is melted to prepare the metal vapor 7, the metal vapor generator 4 ejects the metal vapor 7 from the ejection port according to the set ejection flow rate, and the metal vapor 7 rises to the surface of the negative electrode plate 1 with the airflow, and the metal vapor 7 surrounds the surface of the negative electrode plate 1.

In step S30, the oxygen-containing gas distributed on the surface of the negative electrode plate 1 and the metal vapor 7 directly react to generate metal oxide, and the metal oxide is plated on the surface of the negative electrode plate 1 to form a metal oxide protective layer, wherein the molar ratio of metal atoms to oxygen atoms in the oxide is z.

In practical application process, when metal vapor 7 surrounds the surface of negative electrode plate 1, the oxygen-containing gas generator 3 ejects oxygen at a preset flow rate, and oxygen and metal vapor 7 react on the surface of the negative electrode plate 1 in a vacuum environment to form an extremely thin metal oxide protective layer.

It should be noted that the molar ratio of metal atom and oxygen atom in the metal oxide is z, and $z=22.4 \cdot x \cdot \rho/(y \cdot M)$. Among them, 22.4 is the molar volume of the gas in the standard state, x is the ejection flow rate of the metal vapor 7, y is the ejection flow rate of oxygen, $\rho$ is the density of the metal material 6, and M is the relative atomic mass of the metal material 6.

As the optional technical solution of the present application, the molar ratio of metal atoms to oxygen atoms in the metal oxide is z, wherein $0.2 \leq z \leq 1.9$. Specifically, the molar ratio z of metal atoms to oxygen atoms in the metal oxide can be 0.2, 0.5, 0.8, 1.1, 1.4, 1.7, 1.9, etc. Of course, it can be other values within the above range, which is not specified limited here. Too high the molar ratio z of metal atoms to oxygen atoms in the metal oxide will cause less oxygen vacancies in metal oxides, and too many metal-oxygen covalent bonds that hinder the conduction of sodium ions and electrons, leading to a decrease in the kinetic performance of the battery. Too low the molar ratio z of metal atoms to oxygen atoms in the metal oxide will cause the protective layer to contain more metal elements, and reduce the overall electrochemical stability and mechanical strength of the protective layer, so that the metal oxide cannot effectively protect the sodium metal interface when the volume of the sodium-metal negative electrode plate changes, which reduces the battery's cycle performance. Preferably, the molar ratio of metal atoms to oxygen atoms in the metal oxide is z, where $0.4 \leq z \leq 1.7$.

The thickness of the metal oxide protective layer is from 50 nm to 500 nm. Optionally, the thickness of the metal oxide protective layer may specifically be 50 nm, 150 nm, 250 nm, 350 nm, 450 nm, 500 nm, etc., which is not limited here. If the thickness of the metal oxide protective layer is too high, the energy density of the battery will be reduced, the amount of electricity stored in the battery will be less, and the kinetic performance of the battery will be reduced. If the thickness of the metal oxide protective layer is too thin, the mechanical strength of the metal oxide protective layer is low, the coverage of the negative electrode plate 1 is uneven, and the direct contact between the electrolyte and the negative electrode plate 1 cannot be effectively isolated, resulting in a loss of cell energy density. That is to say, the amount of electricity stored per unit volume is small, and when the volume of the negative electrode changes, the structure of the negative electrode itself is destroyed, which affects the electrochemical performance. Preferably, the thickness of the metal oxide protective layer is from 80 nm to 300 nm.

As the optional technical solution of the present application, the porous barrier layer 5 is porous metal mesh, and optionally, the material of porous metal mesh can be porous iron metal mesh, porous titanium metal mesh, porous tungsten metal mesh, porous molybdenum metal Internet, etc., which are not limited here. Preferably, the material of the porous metal mesh is porous tungsten metal mesh.

The pore size of the porous barrier layer 5 is from 40 μm to 100 μm. Optionally, the pore size of the porous barrier layer 5 may specifically be, but not limited to, 40 μm, 50 μm, 60 μm, 70 μm, 80 μm, 90 μm, 100 μm, etc. Preferably, the pore size of the porous barrier layer 5 may be from 60 to 80 μm. If the pore size of the porous barrier layer 5 is too large, the metal vapor 7 permeates the porous barrier layer 5 too much, and the reaction of the metal vapor 7 is incomplete, resulting in poor performance of the prepared metal oxide protective layer. If the pore size of the porous barrier layer 5 is too small, the metal vapor 7 permeates the porous barrier layer 5 too little, resulting in the prepared metal oxide protective layer too thin.

The distance between two adjacent holes in the porous barrier layer 5 is from 0.1 mm to 1 mm, optionally, the distance between the two adjacent holes in the porous barrier layer 5 may specifically be, but not limited to, 0.1 mm, 0.2 mm, 0.3 mm, 0.4 mm, 0.5 mm, 0.6 mm, 0.7 mm, 0.8 mm, 0.9 mm, 1 mm, etc. Preferably, the distance between two adjacent holes in the porous barrier layer 5 may be from 0.4 mm to 0.6 mm. If the distance between two adjacent holes in the porous barrier layer 5 is too large, too little metal vapor 7 will pass through the porous barrier layer 5, and the prepared metal oxide protective layer will be too thin. If the distance between two adjacent holes in the porous barrier layer 5 is too small, too much metal vapor 7 will pass through the porous barrier layer 5, and the metal vapor 7 will not react completely, resulting in poor performance of the prepared metal oxide protective layer.

In practical application process, the porous barrier layer 5 is provided with a heating device for regulating the temperature of the porous barrier layer 5 and serving heat treatment, thereby making the metal oxide protective layer on the surface of negative electrode plate 1 bright and clean with the higher strength. Under the control of the heating device, the temperature of the porous barrier layer 5 is from 120° C. to 400° C. Optionally, the temperature of the porous barrier layer 5 may specifically be 120° C., 160° C., 200° C., 240° C., 280° C., 320° C., 360° C., 400° C., etc., which is not limited herein. If the temperature of the porous barrier layer 5 is too high, the toughness and thus the impact resistance of the metal oxide protective layer will decrease, and the service life will be shortened. If the temperature of the porous barrier layer 5 is too low, the mechanical strength of the metal oxide protective layer cannot meet the desired requirements, and the performance of the battery decreases. Preferably, the temperature of the porous barrier layer 5 is from 150° C. to 240° C.

In a second aspect, the present application provides a sodium-metal negative electrode plate, wherein the sodium-metal negative electrode plate comprises a negative electrode current collector and a sodium-metal material that is formed on the negative electrode current collector surface, and the surface of sodium metal material is provided with a metal oxide protective layer.

In a third aspect, the present application provide an electrochemical device, comprising a positive electrode plate, a negative electrode plate, a separator and an electrolyte, wherein the negative electrode plate is a sodium-metal negative electrode plate.

The positive electrode plate comprising a positive electrode current collector and a positive electrode active material layer formed on at least a part of the surface of the positive electrode current collector, the positive electrode active material layer comprises a positive electrode active material, and the positive electrode active material may comprise at least one of a sodium transition metal oxide, a polyanionic compound and a Prussian blue compound. However, the present application is not limited to these materials, and other conventionally known materials that can be used as the positive electrode active material for sodium-ion batteries can also be used.

As the optional technical solution of the present application, in the sodium transition metal oxide, the transition metal can be at least one of Mn, Fe, Ni, Co, Cr, Cu, Ti, Zn, V, Zr and Ce. The sodium transition metal oxide is, for example, $NaxMO_2$, wherein M is one or more of Ti, V, Mn, Co, Ni, Fe, Cr and Cu, and $0<x\leq 1$.

As the optional technical solution of the present application, the polyanionic compound can be compounds with sodium ion, transition metal ion and tetrahedral $(YO_4)^{n-}$ anion unit. The transition metal may be at least one of Mn, Fe, Ni, Co, Cr, Cu, Ti, Zn, V, Zr and Ce; Y can be at least one of P, S and Si; n represents the valence state of $(YO_4)^{n-}$.

The polyanionic compound may also be compounds having sodium ions, transition metal ions, tetrahedral $(YO_4)^{n-}$ anion units and halogen anions. The transition metal may be at least one of Mn, Fe, Ni, Co, Cr, Cu, Ti, Zn, V, Zr and Ce; Y may be at least one of P, S and Si, and n represents the valence state of $(YO_4)^{n-}$; the halogen may be at least one of F, Cl and Br.

The polyanionic compound may also be compounds having sodium ions, tetrahedral $(YO_4)^{n-}$ anion units, polyhedral units $(ZO_y)^{m+}$, and optionally halide anions. Y may be at least one of P, S and Si; n represents the valence state of $(YO_4)^{n-}$; Z represents a transition metal, which can be at least one of Mn, Fe, Ni, Co, Cr, Cu, Ti, Zn, V, Zr and Ce; m represents the valence state of $(ZO_y)^{m+}$; the halogen may be at least one of F, Cl and Br.

Polyanionic compound is for example at least one of $NaFePO_4$, $Na_3V_2(PO_4)_3$, $NaM'PO_4F$ (M' is one or more in V, Fe, Mn and Ni) and $Na(VO_y)_2(PO_4)_{re}F_{3-2y}$ ($0\leq y\leq 1$).

Prussian blue compounds may be compounds with sodium ion, transition metal ion and cyanide ion ($CN^-$). The transition metal may be at least one of Mn, Fe, Ni, Co, Cr, Cu, Ti, Zn, V, Zr, and Ce. The Prussian blue compound is, for example, $Na_aMe_bMe'_c(CN)_6$, wherein Me and Me' are each independently at least one of Ni, Cu, Fe, Mn, Co and Zn, $0<a\leq 2$, $0<b<1$, $0<c<1$.

As an optional technical solution of the present application, the positive electrode active material layer can further comprise a conductive agent to improve the electrical conductivity of the positive electrode. The present application does not specifically limit the types of conductive agents, which can be selected according to actual needs. As an example, the conductive agent may be one or more of superconducting carbon, acetylene black, carbon black, Ketjen black, carbon dots, carbon nanotubes, graphite, graphene, and carbon nanofibers.

As an optional technical solution of the present application, the positive electrode active material layer can further comprise a binder to firmly bond the positive electrode active material and the optional conductive agent on the positive electrode current collector. The application does not specifically limit the types of binders, which can be selected according to actual needs. As an example, the binder may be at least one of polyvinylidene fluoride (PVDF), polytetrafluoroethylene (PTFE), polyacrylic acid (PAA), polyvinyl alcohol (PVA), ethylene vinyl acetate (EVA), styrene butadiene rubber (SBR), carboxymethyl cellulose (CMC), sodium alginate (SA), polymethacrylic acid (PMA) and carboxymethyl chitosan (CMCS).

As the optional technical solution of the present application, the positive electrode current collector can adopt conductive carbon sheet, metal foil, carbon-coated metal foil, porous metal plate or composite current collector, wherein the conductive carbon material of conductive carbon sheet may be one or more of superconducting carbon, acetylene black, carbon black, Ketjen black, carbon dots, carbon nanotubes, graphite, graphene and carbon nanofibers; the metal material of metal foils, carbon-coated metal foils and porous metal plates may each independently be selected from at least one of copper, aluminum, nickel, and stainless steel. The composite current collector may be a composite current collector formed by metal foil and polymer base film.

The positive electrode current collector is, for example, one or more of copper foil, aluminum foil, nickel foil, stainless steel foil, stainless steel mesh and carbon-coated aluminum foil, preferably aluminum foil.

The above-mentioned positive electrode plate can be prepared according to conventional methods in the art. Usually, the positive electrode active material and optional conductive agent and binder are dispersed in a solvent (such as N-methylpyrrolidone, abbreviated as NMP) to form a uniform positive electrode slurry, and the positive electrode slurry is applied on the positive electrode current collector, after being dried and cold pressed, the positive electrode plate is obtained.

The separator in the sodium-ion battery of the present application can be various materials suitable for the separator of electrochemical energy storage devices in the art, for example, it can comprise but not be limited to at least one of polyethylene, polypropylene, polyvinylidene fluoride, aramid, polyethylene terephthalate, polytetrafluoroethylene, polyacrylonitrile, polyimide, polyamide, polyester and natural fibers.

Above-mentioned electrolyte can comprise organic solvent and electrolyte sodium salt. As an example, the organic solvent may be one or more of ethylene carbonate, propylene carbonate, diethyl carbonate, dimethyl carbonate, ethyl methyl carbonate, propylene carbonate, methyl acetate, ethyl propionate, fluoroethylene carbonate, diethyl ether, diglyme, triethylene glycol dimethyl ether, tetraethylene glycol dimethyl ether, methyl tert-butyl ether, ethylene carbonate (EC), propylene carbonate (PC), methyl ethyl carbonate (EMC) and diethyl carbonate (DEC); electrolyte sodium salt can be at least one of sodium hexafluorophosphate, sodium bisfluorosulfonimide, sodium bistrifluoromethanesulfonimide, sodium trifluoromethanesulfonate, sodium tetrafluoroborate, sodium difluorophosphate, sodium perchlorate, sodium chloride, $NaPF_6$, $NaClO_4$, $NaBCl_4$, $NaSO_3CF_3$ and $Na(CH_3)C_6H_4SO_3$.

The above-mentioned positive electrode plate, separator, negative electrode plate are stacked in order, making the separator play the role of isolation between positive electrode plate and negative electrode plate, to obtain electric core, which can also be obtained after winding; the battery is placed in the packaging shell (which can be a soft package, a square aluminum shell, a square steel shell, a cylindrical aluminum shell and a cylindrical steel shell), and the electrolyte is injected and sealed to obtain a sodium-ion battery.

In order to make those skilled in the art better understand the technical solution of the application, the present application will be described in further detail below in conjunction with specific embodiments.

Example 1

(1) Preparation of Negative Electrode Plate:

S1: A negative electrode plate 1 was placed in a vacuum chamber 2 by transmission mechanism, while a metal material 6, i.e. zirconium material was placed in a metal vapor generator 4, wherein the density of zirconium material was 6.49 g/cm$^3$, and the relative atomic mass was 91. The metal vapor generator 4 was arranged in the vacuum chamber 2. When the vacuum degree in the vacuum chamber 2 reached the threshold requirement, the zirconium material continued to melt and vaporize in the metal vapor generator 4 to form metal vapor 7, and the ejection flow rate of the metal vapor 7 was 500 ml/min, thus the negative electrode plate 1 was immersed in the metal vapor 7. Among them, the vacuum degree can be achieved by the vacuum unit 8, the vacuum degree was ≤8×10$^{-2}$ Pa, and the threshold requirement of the vacuum degree can be achieved by setting the parameters of the vacuum unit 8. A porous barrier layer 5 was arranged below the negative electrode plate 1, wherein the pore size of the porous barrier layer 5 was 80 μm, and the distance between two adjacent holes in the porous barrier layer 5 was 0.5 mm.

S2: An oxygen-containing gas generator 3 was arranged below the negative electrode plate 1, and the ejection flow of the oxygen-containing gas was 500 ml/min. Oxygen-containing gas generators 3 were respectively arranged on both sides of the porous barrier layer 5, so that oxygen can be ejected from both sides of the surface of the negative electrode plate.

S3: The oxygen distributed on the surface of the negative electrode plate 1 reacted directly with the metal vapor 7 to generate metal oxides, and the negative electrode plate 1 was wound back and forth on both sides for continuous vaporization, and the vaporization speed reached ≥300 m/min. Both the upper and lower surfaces of the negative electrode plate 1 were plated with a metal oxide layer. The thickness of the protective layer was controlled by controlling the flow rate of the metal vapor 7 and the injection rate of oxygen, so that the thickness of the protective layer was 30 nm. From the above parameters, $z = 22.4 \cdot x \cdot \rho/(y \cdot M)$ was calculated.

(2) Preparation of Positive Electrode Plate:

10 wt % polyvinylidene fluoride binder was fully dissolved in N-methylpyrrolidone, and then 10 wt % carbon black conductive agent and 80 wt % Na$_4$Fe$_3$(PO$_4$)$_2$(P$_2$O$_7$) positive active material were added to make uniformly dispersed slurry. The slurry was evenly applied on the zirconium surface and then transferred to a vacuum drying oven to dry completely. The resulting electrode plate was rolled and then punched out to obtain a target wafer.

(3) Preparation of Separator:

Celgard isolation membrane was used.

(4) Preparation of Electrolyte:

Ethylene glycol dimethyl ether (DME) was used as the organic solvent, and then the fully dried sodium salt NaPF$_6$ was dissolved in the mixed organic solvent to prepare an electrolyte with a concentration of 1 mol/L.

(5) Preparation of Button Battery:

The above-mentioned positive electrode plate, separator, and negative electrode plate were stacked in sequence, so that the separator was placed between the positive and negative electrode plates to play a role of isolation, and the above electrolyte was added to assemble a button battery.

Examples 1 to 12 and comparative examples 1 to 5 were obtained according to above-mentioned processing method, and specific parameters were shown in Table 1.

TABLE 1

| No. | Type of protective layer | Thickness of metal oxide protective layer | Type of metal material | Ratio of metal/oxygen z |
|---|---|---|---|---|
| Example 1 | Metal oxide | 50 nm | Zirconium | 1.6 |
| Example 2 | Metal oxide | 80 nm | Zirconium | 1.6 |
| Example 3 | Metal oxide | 300 nm | Zirconium | 1.6 |
| Example 4 | Metal oxide | 500 nm | Zirconium | 1.6 |
| Example 5 | Metal oxide | 80 nm | Aluminum | 1.6 |
| Example 6 | Metal oxide | 80 nm | Titanium | 1.6 |
| Example 7 | Metal oxide | 80 nm | Magnesium | 1.6 |
| Example 8 | Metal oxide | 80 nm | Zirconium | 0.2 |
| Example 9 | Metal oxide | 80 nm | Zirconium | 0.4 |
| Example 10 | Metal oxide | 80 nm | Zirconium | 1.0 |
| Example 11 | Metal oxide | 80 nm | Zirconium | 1.7 |
| Example 12 | Metal oxide | 80 nm | Zirconium | 1.9 |
| Comparative Example 1 | Metal oxide | 30 nm | Zirconium | 1.6 |
| Comparative Example 2 | Metal oxide | 600 nm | Zirconium | 1.6 |
| Comparative Example 3 | Metal oxide | 80 nm | Zirconium | 0.1 |
| Comparative Example 4 | Metal oxide | 80 nm | Zirconium | 2.0 |
| Comparative Example 5 | No protective layer | / | / | 1 |

Notes: SEM was used to carry out cross-sectional imaging to the electrode plate of liquid nitrogen quenching cutting, and the thickness of metal oxide protective layer was measured by secondary electron image.

Performance Test of Battery:

(1) Initial charge-discharge efficiency: at 25° C., the battery prepared by the examples and comparative example was charged to 4V with a 0.1 C rate, discharged to 1V with a 0.1 C rate, and a fully charged and discharged cycle test was carried out. The ratio of discharge capacity to charge capacity was the initial charge-discharge efficiency.

(2) Cycle performance: under 25° C., the battery prepared by the examples and comparative example was charged to 4V with 0.1 C rate, discharged to 1V with 0.1 C rate, and a fully charged and discharged cycle test was carried out, until the capacity of the battery sodium-ion was less than 80% of the initial capacity, and the number of cycles was recorded.

TABLE 2

Test result of initial charge-discharge efficiency and cycle performance

| No. | Initial charge-discharge efficiency (%) | Number of cycles |
|---|---|---|
| Example 1 | 91 | 718 |
| Example 2 | 94 | 815 |
| Example 3 | 92 | 756 |
| Example 4 | 88 | 677 |
| Example 5 | 91 | 711 |
| Example 6 | 92 | 727 |
| Example 7 | 91 | 731 |
| Example 8 | 87 | 656 |
| Example 9 | 88 | 689 |
| Example 10 | 89 | 719 |

TABLE 2-continued

Test result of initial charge-discharge efficiency and cycle performance

| No. | Initial charge-discharge efficiency (%) | Number of cycles |
|---|---|---|
| Example 11 | 91 | 758 |
| Example 12 | 87 | 681 |
| Comparative Example 1 | 77 | 434 |
| Comparative Example 2 | 87 | 630 |
| Comparative Example 3 | 86 | 621 |
| Comparative Example 4 | 85 | 713 |
| Comparative Example 5 | 72 | 397 |

It can be known from Examples 1 to 4 and Comparative Examples 1 to 2 that when the thickness of the metal oxide protective layer was within 50 nm to 500 nm, the battery had higher initial charge-discharge efficiency and cycle number. According to the test data of Comparative Example 1, if the thickness of the metal oxide protective layer was too thin, the mechanical strength of the metal oxide protective layer was low, and the uniformity of the metal oxide covering the surface of the negative electrode plate was reduced, so that the electrolyte cannot be effectively prevented from directly contacting the negative electrode, which resulted in the loss of the energy density of the cell, and a decrease in the initial charge-discharge efficiency of the battery; moreover, the side reaction between the negative electrode plate and the electrolyte intensified, and the volume expansion of the electrode plate destroyed the structure of the negative electrode itself, which affected the battery's cycle performance. According to the test data of Comparative Example 2, if the thickness of the metal oxide protective layer was too thick, the initial charge-discharge efficiency of the battery decreased, resulting in a decrease in the kinetic performance of the battery. Preferably, the thickness of the metal oxide protective layer was from 80 nm to 300 nm.

As can be seen from Examples 5 to 7, the metal oxide protective layers prepared by different metal materials had an impact on the kinetics and electrochemical performance of batteries. Preferably, the protective layer made of zirconium metal material had better performance, and the initial charge-discharge efficiency and cycle number of the battery were better than those of other metal materials.

As can be seen from Examples 8 to 12 and Comparative Examples 3 to 4, the molar ratios of metal atoms and oxygen atoms in the metal oxide were different, and the kinetics of the battery and the electrochemical performance were changed. According to the test data of Comparative Example 4, if the molar ratio z of the metal atoms to oxygen atoms was too high, it will cause too few oxygen vacancies in metal oxides and too many metal-oxygen covalent bonds, which will hinder the conduction of sodium ions and electrons and lower the battery's kinetics performance. According to the test data of Comparative Example 3, if the molar ratio z of metal atoms to oxygen atoms was too low, the metal oxide protective layer will contain more metal elements, which will reduce the overall electrochemical stability and mechanical strength of the metal oxide protective layer, so that the metal oxide cannot effectively protect the sodium metal interface when the volume of the negative electrode plate changed, resulting in a decrease in the battery's cycle performance. Preferably, the molar ratio z of metal atoms to oxygen atoms in the metal oxide satisfies $0.4 \leq z \leq 1.7$.

As can be seen from the known data of Examples 1 to 12 and Comparative Examples 1 to 5, the adjustment of the thickness of metal oxide protective layer, the type of metal material, the molar ratio z of metal atom and oxygen atom all had a significant effect on the initial Coulombic efficiency and cycle life of the battery. The electrode plate with a metal oxide protective layer can effectively improve the initial charge-discharge efficiency and improve the cycle life. Compared with the traditional soft and hard carbon negative electrode, the sodium-metal negative electrode protected by the metal oxide protective layer can greatly improve the overall energy density of the battery, and the battery can store more electricity per unit volume. Compared with the direct use of the sodium-metal negative electrode (Comparative Example 5), the sodium-metal negative electrode containing the metal oxide protective layer can effectively solve the problems of low melting point, high chemical activity, and poor cycle performance of sodium metal, thereby greatly improving the production rate, reducing processing costs, and improving battery life.

Although the application is disclosed above in preferred embodiments, they are not intended to limit the claims, any person skilled in the art can make some possible changes and modifications without departing from the concept of the present application. Therefore the protection scope of this application shall be determined by the protection scope of the claims.

What is claimed is:

1. A method for processing a negative electrode plate, comprising the steps of:
arranging the negative electrode plate in a vacuum chamber, wherein the negative electrode plate is close to an oxygen-containing gas generator and a metal vapor generator, and wherein a side of the negative electrode plate close to the oxygen-containing gas generator is provided with a porous barrier layer; melting a metal material and ejecting metal vapor by the metal vapor generator, so that the negative electrode plate is immersed in the metal vapor, wherein an ejection flow rate of the metal vapor is x ml/min, density of the metal material is ρ g/cm, and relative atomic mass of the metal material is M;
ejecting oxygen-containing gas by the oxygen-containing gas generator along the porous barrier layer, wherein an ejection flow rate of the oxygen-containing gas is y ml/min;
directly reacting the oxygen-containing gas distributed on a surface of the negative electrode plate with the metal vapor to generate a metal oxide, so that the metal oxide is plated on the surface of the negative electrode plate to form a metal oxide protective layer, wherein a molar ratio of metal atoms to oxygen atoms in the metal oxide is z, and wherein $z=22.4 \cdot x \cdot \rho/(y \cdot M)$, wherein the negative electrode plate comprises a negative electrode current collector, wherein the negative electrode plate comprises a sodium metal material formed on a surface of the negative electrode current collector, wherein the method satisfies the following characteristics:
(A) the porous barrier layer is a porous metal mesh, and the porous metal mesh comprises a material selected from the group consisting of iron, titanium, tungsten, and molybdenum;
(B) the porous barrier layer having pores wherein the pores have a pore size of from 40 μm to 100 μm; and
(C) a distance between two adjacent pores in the porous barrier layer (5) is from 0.1 mm to 1 mm.

2. The method according to claim 1, wherein the negative electrode current collector comprises at least one of a copper foil current collector, an aluminum foil current collector, a copper-based composite current collector, and an aluminum-based composite current collector.

3. The method according to claim 1, wherein
(1) the molar ratio of metal atoms to oxygen atoms in the metal oxide is z, $0.2 \leq z \leq 1.9$;
(2) the molar ratio of metal atoms to oxygen atoms in the metal oxide is z, $0.4 \leq z \leq 1.7$; and/or
the metal oxide protective layer has a thickness of from 50 nm to 500 nm.

4. The method according to claim 1, wherein the metal material comprises at least one of magnesium, aluminum, zirconium, titanium, vanadium, chromium, and manganese.

5. The method according to claim 1, wherein the porous barrier layer is connected with a heating device, and the heating device is configured to regulate the temperature of the porous barrier layer; and/or, the temperature of the porous barrier layer is from 120° C. to 400° C.

6. The method according to claim 1, wherein a vacuum environment has a vacuum degree of $\leq 8 \times 10^{-2}$ Pa.

* * * * *